US00RE38319E

(19) United States
(12) Reissued Patent
Lin et al.

(10) Patent Number: US RE38,319 E
(45) Date of Reissued Patent: Nov. 18, 2003

(54) DUAL-NODE CAPACITOR COUPLED MOSFET FOR IMPROVING ESD PERFORMANCE

(75) Inventors: Shin-Tron Lin, Taipei (TW); Shyh-Chyi Wong, Hsinchu (TW)

(73) Assignee: Winbond Electronics Corporation (TW)

(21) Appl. No.: 09/961,341

(22) Filed: Sep. 25, 2001

Related U.S. Patent Documents

Reissue of:
(64) Patent No.: 5,959,488
Issued: Sep. 28, 1999
Appl. No.: 09/012,928
Filed: Jan. 24, 1998

(51) Int. Cl.[7] ..... H03K 5/08
(52) U.S. Cl. ..... 327/313; 327/318; 327/566
(58) Field of Search ..... 327/309, 310, 327/313, 318, 319, 321, 328, 333, 530, 534, 564, 565, 566

(56) References Cited

U.S. PATENT DOCUMENTS

| | | | | |
|---|---|---|---|---|
| 4,423,431 A | | 12/1983 | Sasaki | 357/41 |
| 5,528,188 A | | 6/1996 | Au et al. | 327/310 |
| 5,631,793 A | | 5/1997 | Ker et al. | 361/56 |
| 5,686,751 A | | 11/1997 | Wu | 257/356 |
| 5,721,656 A | | 2/1998 | Wu et al. | 361/56 |
| 5,818,086 A | | 10/1998 | Lin et al. | 257/355 |
| 5,852,541 A | | 12/1998 | Lin et al. | 361/111 |
| 6,249,410 B1 | * | 6/2001 | Ker et al. | 361/111 |

* cited by examiner

*Primary Examiner*—Jeffrey Zweizig
(74) *Attorney, Agent, or Firm*—Finnegan, Henderson, Farabow, Garrett & Dunner, L.L.P.

(57) ABSTRACT

A dual-node capacitor coupling technique is used to lower the trigger voltage and to improve the uniform turn-on of a multi-finger MOSFET transistor. Preferably, each MOSFET is an NMOS device. Specifically, each NMOS device includes a capacitor that is connected between the gate of the NMOS device and the pad terminal. A first resistor is connected between the gate and the p-well, while a second resistor is connected between the p-well and the grounded source. For a positive ESD pulse to VSS, the p-well is pulled up to approximately 0.7 V during the initial ESD event, such that the source junction is forward biased and that the trigger voltage of the NMOS device is lowered. At the same time the gate voltage is coupled within the range of approximately 1 to 2 V to promote the uniform turn on of the gate fingers of the NMOS devices during the initial ESD event.

57 Claims, 3 Drawing Sheets

DUAL-NODE CAPACITOR COUPLED MOSFET FOR IMPROVING ESD PERFORMANCE

Matter enclosed in heavy brackets [ ] appears in the original patent but forms no part of this reissue specification; matter printed in italics indicates the additions made by reissue.

FIELD OF THE INVENTION

The present invention relates to a primary ESD protection circuit, and more particularly, the present invention relates to a primary ESD protection circuit having a dual-node capacitor coupled multi-finger NMOSFET structure.

BACKGROUND OF THE INVENTION

Electrostatic discharges (ESDs) from human handling of a metal-oxide semiconductor (MOS) IC chip, or from other causes, permanently damage the IC chip. Often the thin-oxide layer that isolates the gate electrode from the substrate of a MOS field effect transistor is irreparably ruptured by a voltage spike applied across it. A voltage spike or ESD is often applied to the gate, because the gate electrode is connected to an external terminal or pin of the IC chip. The external terminals are formed on an input or output pad. To prevent such damage from excessive electrostatic discharges, a protective device is often connected between the pad and the internal circuits.

As CMOS technology is scaled down into submicron regime, the processes and the structures, such as a thinner gate oxide, shorter channel length, shallower source/drain junction, LDD (Lightly-Doped Drain) structure, and silicided diffusion, greatly degrade the ESD robustness of submicron CMOS ICs. Submicron CMOS devices, such as short channel thin-oxide MOS devices, are extremely susceptible to ESD damage. Therefore, ESD protection has become one of the most important elements with respect to the reliability of submicron CMOS ICs.

An NMOSFET is a very effective ESD protection device. Specifically, NMOS devices, either with the gate grounded (GGNMOS) or with the gate coupled to the positive ESD transient voltage (GCNMOS), have been commonly used as primary ESD protection elements for integrated circuits.

GGNMOS or GCNMOS can be used as the primary ESD protection element for ESD protection of an input pin. The input pad is connected to the drain of the NMOS, whose gate is either grounded or coupled to the drain and VSS by a capacitor and a resistor. The drain of the NMOS transistor is then connected to a series resistor of the order of 200 ohms, and then a secondary ESD protection element (say, a smaller GGNMOS) before connected to the first input gate.

In one application, an NMOS is used as the pull down transistor of a CMOS buffer to drive an output voltage for an external device. In this type of application, the gate of the NMOS is connected to an output driving signal.

In another common NMOS application, the gate is electrically connected to ground, and the NMOS is used as an ESD protection device for an input pin or a power bus during an ESD event.

The ESD protective action of an NMOS is based on the device's snap-back mechanism, which enables the NMOS to conduct a high level of ESD current between its drain and source. This occurs when a strong electric field across the depletion region in the drain substrate junction becomes high enough to begin avalanche breakdown, which in turn causes impact ionization, resulting in the generation of both minority and majority carriers. The minority carriers flow toward the drain contact, and the majority carrier flow toward the substrate/p-well contact, causing a local potential build up across the current path in the p-well substrate.

When the local substrate potential is 0.6 V high than an adjacent n+ source potential, the source junction becomes forward biased. The forward biased source junction then injects minority carriers (electrons) into the p-well, and these carriers eventually reach the drain junction to further enhance the impact ionization effect (see "ESD in Silicon Integrated Circuits", by A. Amerasekera and C. Duvvury Chap. 3, Sec. 1., John Wiley & Sons, 1995). Eventually, the NMOS reaches a low impedance (snap-back) state, which enables it to conduct a large amount of ESD current.

To enhance the ESD protection capabilities of a MOSFET device, it is desirable to have a rapid turn on with a high degree of uniformity throughout the device. A known technique for accomplishing this objective utilizes a multi-gate-finger configuration to increase the gate effectiveness. However, in a typical multi-gate-finger NMOS structure, as shown in FIGS. 1 and 2, not all the poly gate fingers may turn on during an ESD event. That is, when the first few gate fingers reach their snap-back low impedance mode, the drain terminal to source terminal voltage is reduced to a value, called the snap-back voltage, which is less than the trigger voltage of the NMOS device. This has the effect of preventing the remaining gate fingers from being turned on. As a result, only a partial number of the gate fingers are available to absorb the ESD energy. Therefore, the ESD protection provided by the NMOS is significantly reduced.

When a MOSFET gate finger is triggered during an ESD event, the entire finger turns on. This is due to the cascading effect of the previously described impact ionization and snap-back process along the entire gate finger. Moreover, experimental data indicates that a long-gate-finger structure (e.g. 100 um×2), as shown in FIG. 4, has better ESD performance than a short-gate-finger structure (e.g. 20 um×10), of the type shown in FIG. 1, where both structures have the same total gate width of 200 um. That is, during an ESD event, the long-finger NMOS structure will have either one or two gate fingers (50% to 100% of total gate width) turned on, while the short-finger NMOS may only have a few fingers (out of 10) turned on, with each finger being only 10% of the total gate width, thus reducing the short-finger MOSFET's ability to absorb ESD current as compared to the long finger configuration. For manufacturing purposes, however, layout area is typically at a premium, and a conventional long-finger structure may not fit in the designated layout area. Therefore, both multi-gate-finger (short) and long-gate-finger (long) types of structures are used, depending on physical and electrical priorities.

A commonly used multi-gate-finger structure is shown in FIG. 4, where the poly-gate fingers are connected by a poly-gate bus, rather than the metal bus of FIG. 1.

One prior art technique for improving the uniform turn on of such a multi-gage-finger NMOS structure uses a gate coupled technique, as shown in FIG. 5, and as described in "ESD in Silicon Integrated Circuits", A. Amerasekera and C. Duvvury, Chap. 4, Sec. 2., John Wiley & Sons, 1995. In this configuration, the drain is connected to either VDD or the buffer output line, and the gate is coupled to the drain via a capacitor C, and is also connected to ground via a resistor R. The coupling capacitor C and the RC time constant of the circuit cause the gate potential to rise to 1 to 2 V during the first 5 to 10 ns of an ESD event. The positive gate voltage reduces the triggering threshold of the NMOS, thereby enabling a more uniform turn-on of the gate fingers. However, improving the uniformity of the turn-on state of each finger is desirable.

SUMMARY OF THE INVENTION

The present invention overcomes the deficiencies of the prior art. Specifically, a dual-node capacitor coupling technique is used to lower the trigger voltage and to improve the uniform turn-on of a multi-finger MOSFET transistor.

Preferably, each MOSFET is an NMOS device, although it will be understood by those skilled in the art that PMOS devices may be used as desired. Each NMOS device includes a capacitor that is connected between the gate of the NMOS device and the pad terminal. A first resistor is connected between the gate and the p-well, while a second resistor is connected between the p-well and the grounded source. For a positive ESD pulse to VSS, the p-well is pulled up to approximately 0.7 V during the initial ESD event, such that the source junction is forward biased and that the trigger voltage of the NMOS device is lowered. At the same time, the gate voltage is coupled within the range of approximately 1 to 2 V to promote the uniform turn on of the gate fingers of the NMOS devices during the initial ESD event.

In another embodiment the input signal line from the pad terminal is replaced by a VDD line from a VDD source to protect against a bus-to-bus ESD event, from VDD to VSS.

BRIEF DESCRIPTION OF THE DRAWINGS

The following detailed description, giving by way of example and not intended to limit the present invention solely thereto, will best be understood in conjunction with the accompanying drawings in which like reference numbers depict like elements.

DETAILED DESCRIPTION OF THE INVENTION

The present invention improves over conventional gate-coupling and well-coupling techniques in that the embodiments provide a lower trigger voltage for each MOSFET in the multi-finger MOSFET device, while improving the turn-on consistency for each MOSFET. Note that, although the present invention is particularly well suited to a multi-finger MOSFET ESD protection device, the present invention may also be employed in a single MOSFET device while providing stellar results.

Figure 1:
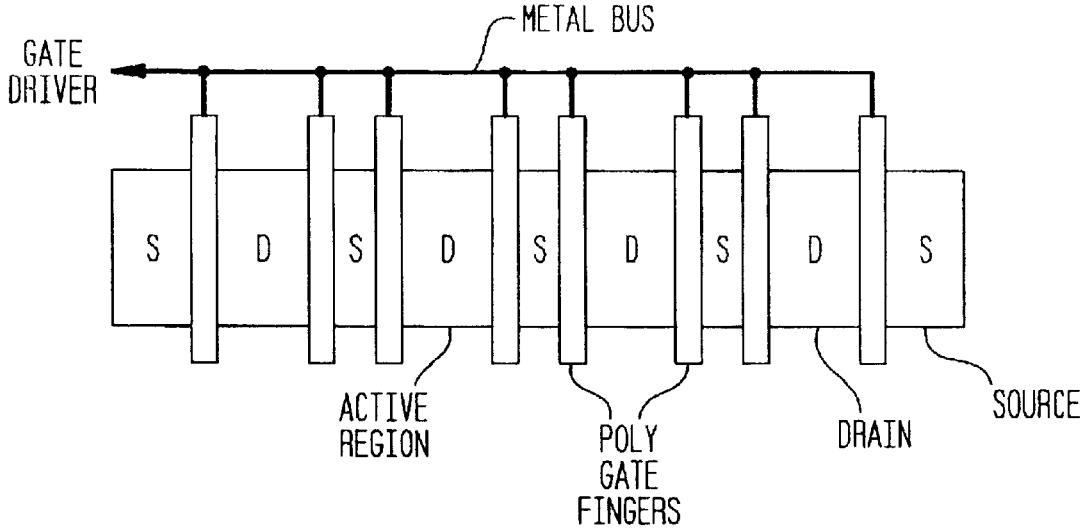
FIG. 1 (PRIOR ART)
FIG. 1 shows a conventional multi-gate-finger NMOS structure.
Figure 2:
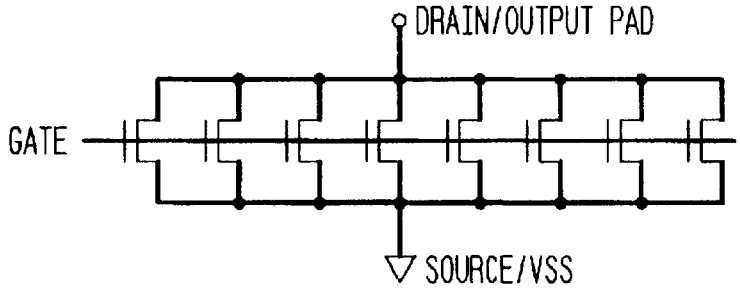
FIG. 2 (PRIOR ART)
FIG. 2 is a schematic representation of the structure of FIG. 1.
Figure 5:
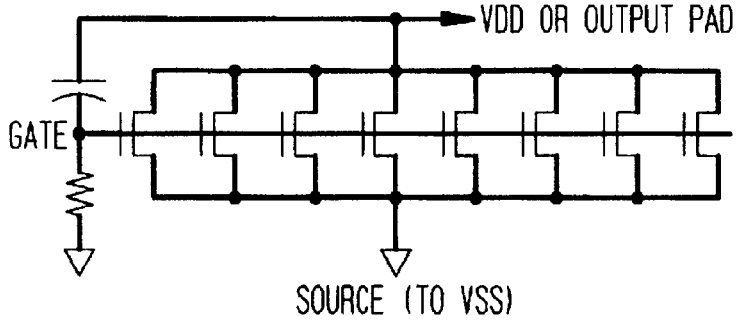
FIG. 5 (PRIOR ART)
FIG. 5 is a schematic representation of a gate-coupled MOSFET.
Figure 3:
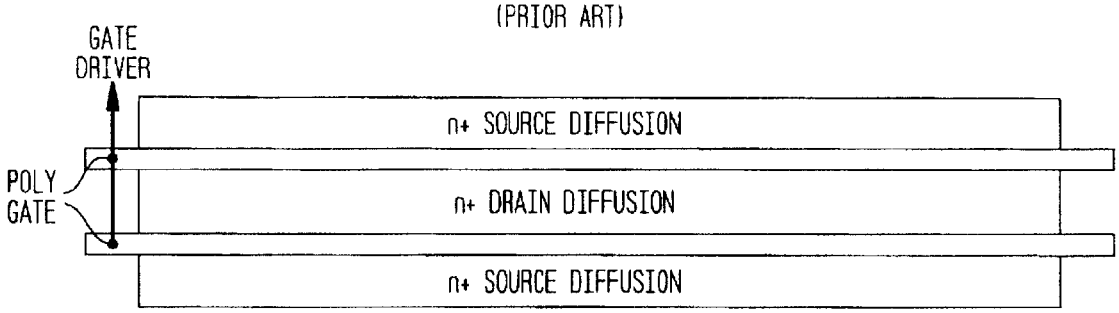
FIG. 3 (PRIOR ART)
FIG. 3 shows a conventional long-gate finger structure.
Figure 4:
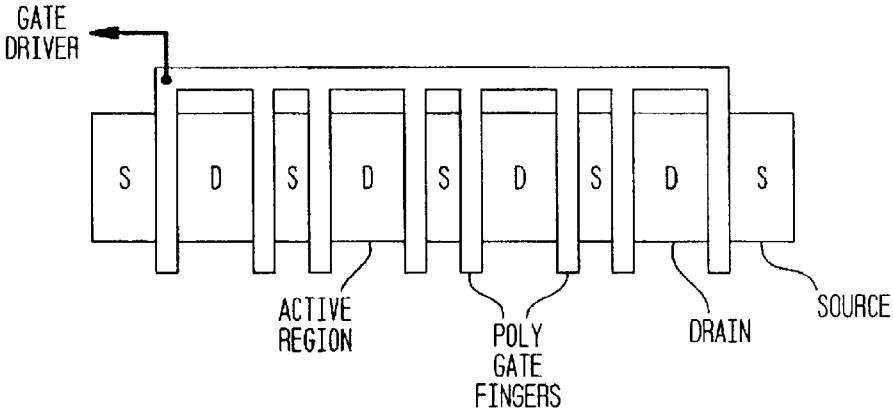
FIG. 4 (PRIOR ART)
FIG. 4 depicts another conventional multi-gate-finger NMOS structure.
Figure 6:
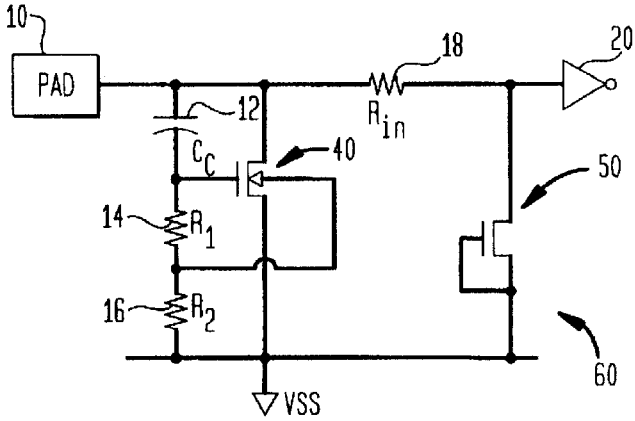
FIG. 6 shows a dual-node capacitor in accordance with a first embodiment of the present invention.

FIG. 6 shows an ESD protection device 60 having a dual-node capacitor in accordance with a first embodiment of the present invention. Protection device 60 is positioned between an IC pad terminal 10 and a buffer 20 that connects to an internal circuit (not shown) to be protected from an ESD event.

Device 60 includes a primary protection circuit that includes MOSFET 40, capacitor 12, and first and second resistors 14, 16, respectively. Illustratively, MOSFET 40 is an NMOS transistor but as previously discussed, may be a PMOS transistor as well. In addition, although only one NMOS transistor is shown, it is to be understood that multiple transistors may be connected in parallel, with their poly gates connected together to a capacitor and first and second resistors, to form a dual-node capacitor coupled multi-finger MOSFET device. Accordingly, the protection device of FIG. 6 preferably has a multi-finger structure.

Referring back to FIG. 6, capacitor 12 is connected between the gate of NMOS device 40 and pad 10. First resistor 14 is connected between the gate and the p-well (or bulk), while second resistor 16 is connected between the p-well and the grounded source (to VSS) of the NMOS. In addition, a resistor 18 is located between pad 10 and buffer 20. Further, an optional secondary ESD protection circuit, comprising a smaller NMOSFET 50, is included as well.

Note that if MOSFET device 40 was a PMOSFET (so that its bulk is formed of an n-well region), its drain would be connected between pad 10 and buffer 20, and its source would be connected to power source VDD.

The basic operation of FIG. 6 will now be discussed. In particular, the unique structure of a single capacitor and two serially connected resistors simultaneously pulls the p-well voltage potential, of each NMOS in the multi-finger structure, to approximately 0.7 V. In addition, the gate voltage potential is pulled within the approximate range of 1 to 2 V during the first 5 to 10 ns of the ESD event. As an example, the resistor ratio $R_1R/R_2$ is in the range of 0.2 to 5, and preferably in the range of 0.5 to 2.

As discussed, a 1 to 2 V gate potential assists in the uniform turn-on of NMOS fingers during an ESD event. An approximate 0.7 V p-well potential, during the initial ESD event, causes the source junction to become forward-biased such that minority carriers are injected which, when flowing towards the drain, help to reduce the trigger voltage of the snap-back mechanism so as to improve the ESD robustness of the NMOS transistor.

Figure 7:
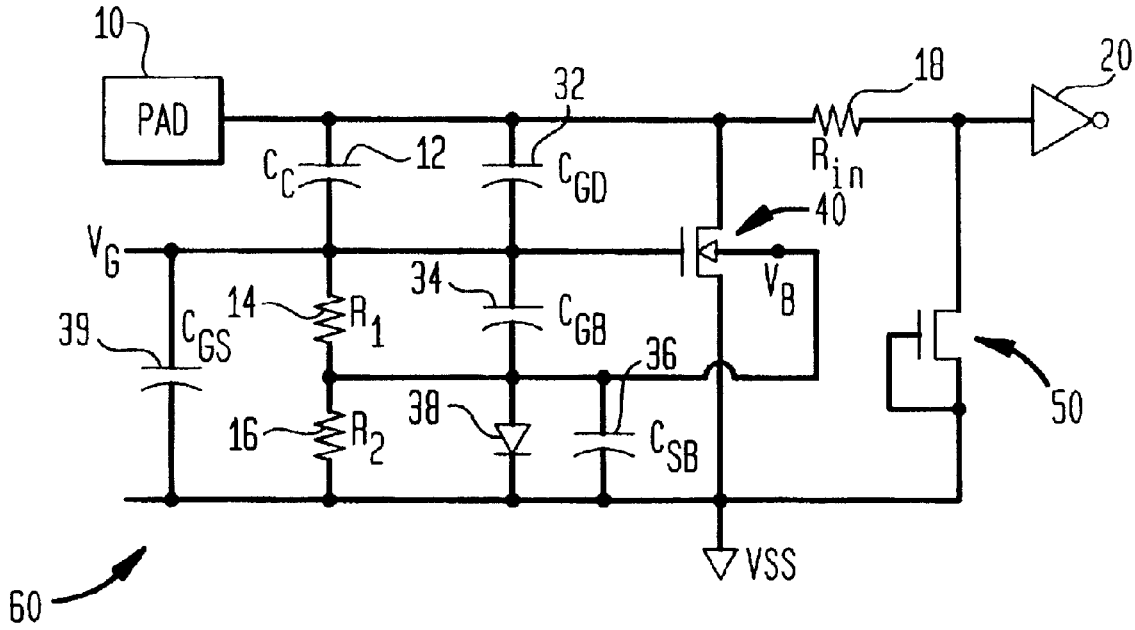
FIG. 7 shows the inherent capacitor properties of the dual-node capacitor of FIG. 7 of the present invention.

FIG. 7 shows the inherent parasitic capacitor properties of the dual-node capacitor of FIG. 6 of the present invention. Specifically, device 60 is now shown having parasitic capacitor 32 (ground-to-drain), 34 (ground-to-bulk), 36 (source-to-bulk), 39 (gate-to-source), as well as diode 38.

The operation of FIGS. 6 will now be discussed with greater detail with reference to FIG. 7. During the first 5 to 10 ns of an ESD event, the voltage potential of the p-well (Vb) is pulled up and pinned at the forward-bias voltage (to approximately 0.7 V) of the p-well to n-source junction diode. The gate potential (Vg) is pulled up to within the range of approximately 1 to 2 V due to the capacitor coupling 12, while the pad terminal 10 is around 1.5 to 20 V. The coupling ratio is determined by the following equation:

$$(C_c+C_{GD})/(C_{GD}+C_{GS}+C_{GS}), \quad (1)$$

where $C_C$ is the coupling capacitance between the drain and the gate, $C_{GD}$ is the gate-to-drain overlap capacitance, $C_{GS}$ is the gate-to-source overlap capacitance and $C_{GB}$ is the gate-oxide capacitance. The initial R-C relaxation time constant when the source junction is pinned at forward biasing may be expressed by the following equation:

$$R1*(C_c+C_{GD}+C_{GS}+C_{GS}), \quad (2)$$

which is preferably designed to be within the range of approximately 10 to 30 ns. As an example, the coupling capacitor used in the order of 0.5 to 3 PF, and R1 (resistor 14) and R2 (resistor 16) are in the order to 4 to 20 Kohms.

Figure 8:
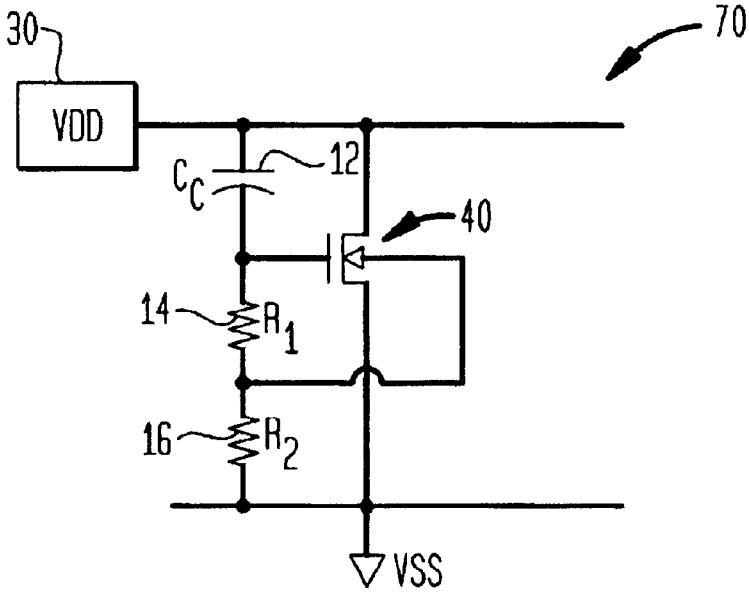
FIG. 8 shows a portion of a dual-node capacitor in accordance with a second embodiment of the present invention.

FIG. 8 illustrates and alternative embodiment of the present invention. Specifically, the inventive primary ESD protection circuit 80 is employed to protect against a bus-to-bus ESD event, from VDD to VSS. Accordingly, the input signal line from pad terminal 10 of FIG. 6 is replaced by a VDD line from VDD source 30, as shown in FIG. 8.

*Furthermore, the pad terminal 10 in FIG. 6 or the first power bus (VDD) in FIG. 8 can be deemed as a first stress node, and the second power bus (VSS) can be deemed as a second stress node. Since the gate of the MOSFET device 40 and the p-well (base) are coupled to the first stress at least by a first common element (e.g., the capacitor 12) and also coupled to the second stress node at least by a second common element (e.g., the resistor 16), during an ESD event, either the first and second stress node may see a high ESD voltage, and the first and second stress nodes can bypass an ESD current when the ESD protection circuit is triggered to conduct a larger ESD transient current.*

Finally, the above-discussion is intended to be merely illustrative of the invention. Numerous alternative embodiments may be devised by those having ordinary skill in the art without departing from the spirit and scope of the following claims.

What is claimed is:

1. An ESD protection circuit for lowering the trigger voltage and improving the turn-on consistency of a MOSFET device, comprising:

a MOSFET device having a source, a drain, a gate and a bulk;

a capacitor connected the gate of said MOSFET and a pad terminal;

a first resistor connected between the gate and the bulk of said MOSFET; and a second resistor connected between the bulk and a power bus.

2. The circuit of claim 1, wherein said source is connected to said power bus.

3. The circuit of claim 1, wherein said MOSFET is a PMOSFET.

4. The circuit of claim 3, wherein said power bus is VDD.

5. The circuit of claim 1, further comprising multiple MOSFET devices connected in parallel, wherein all gates of said multiple MOSFET devices are electrically connected together.

6. The circuit of claim 5, wherein at least two drains of said multiple MOSFET devices are electrically connected together.

7. The circuit of claim 5, wherein at least two MOSFET devices share a common drain diffusion region.

8. The circuit of claim 5, wherein at least two sources of said multiple MOSFET devices are electrically connected together.

9. The circuit of claim 5, wherein at least two MOSFET devices share a common source diffusion region.

10. The circuit of claim 5, wherein said multiple MOSFET devices form a multi-finger structure.

11. The circuit of claim 1, wherein said drain is connected between said pad and a buffer.

12. The circuit of claim 11, wherein said bulk is a p-well, said p-well having a voltage potential of approximately 0.7 V, and said gate has a voltage potential approximately in the range of 1.0 to 2.0 V during as ESD event.

13. The circuit of claim 1, wherein said MOSFET is an NMOSFET.

14. The circuit of claim 13, wherein said power bus is a GND.

15. The circuit of claim 1, further comprising a third resistor connected between said pad terminal and a buffer.

16. The circuit of claim 15, further comprising a second MOSFET coupled between said buffer and said power bus.

17. An ESD protection circuit for lowering the trigger voltage and improving the turn-on consistency of a MOSFET device, comprising:

a MOSFET device having a source, a drain, a gate and a bulk;

a capacitor connected between the gate of said MOSFET and a first power bus;

a first resistor connected between the gate and the bulk of said MOSFET; and second resistor connected between the bulk and a second power bus.

18. The circuit of claim 17, wherein said first power bus is a VDD bus and said second power bus is a VSS bus.

19. The circuit of claim 17, wherein said first power bus is a VDD bus and said second power bus is GND.

20. The circuit of claim 17, wherein said drain of said MOSFET is connected to said first power bus and said source of said MOSFET is connected to said second power bus.

21. The circuit of claim 17, wherein said second resistor is in series with said first resistor.

22. An ESD protection structure, comprising:

a MOSFET device comprising a source, a drain, a gate and a body;

a capacitor coupled between said gate and said drain;

a first resistor coupled between said gate and said body; and a second resistor coupled between said body and said source.

23. The circuit of claim 22, wherein said source is connected to a power bus.

24. The circuit of claim 23, wherein said power bus is a GND.

25. The circuit of claim 22, wherein said MOSFET is a PMOSFET.

26. The circuit of claim 22, further comprising multiple MOSFET devices connected in parallel, wherein all gates of said multiple MOSFET devices are electrically connected together.

27. The circuit of claim 26, wherein at least two drains of said multiple MOSFET devices are electrically connected together.

28. The circuit of claim 26, wherein at least two MOSFET device share a common drain diffusion region.

29. The circuit of claim 26, wherein at least two sources of said multiple MOSFET devices are electrically connected together.

30. The circuit of claim 26, wherein at least two MOSFET device share a common source diffusion region.

31. The circuit of claim 26, wherein said multiple MOSFET devices form a multi-finger structure.

32. The circuit of claim 22, wherein said drain is connected between a pad and a buffer.

33. The circuit of claim 22, wherein said MOSFET is an NMOSFET.

34. The circuit of claim 22, further comprising a third resistor connected between said drain and a buffer.

*35. An ESD protection circuit for an integrated circuit, comprising:*

*a MOS transistor having a source node, a drain node, a gate node and a base node, wherein said gate node is coupled to a first node through a capacitor and is coupled to a second node through a first resistor, wherein said base node is coupled to the first node through said capacitor and is coupled to the second node through said first resistor, and wherein said first node is subject to electrostatic-discharge stress during an ESD event.*

*36. The circuit of claim 35, wherein said first node is coupled to said drain node.*

*37. The circuit of claim 35, wherein said first node is coupled to a signal pad.*

*38. The circuit of claim 35, wherein said first node is coupled to a first power bus.*

*39. The circuit of claim 35, wherein said second node is coupled to said source node.*

*40. The circuit of claim 35, wherein said second node is coupled to a second power bus.*

*41. The circuit of claim 35, wherein said MOS transistor is a NMOS transistor, said base node being a p-well, and said second node being coupled to VSS.*

*42. The circuit of claim 35, wherein said MOS transistor is a PMOS transistor, said base note being an n-well, and said second node being coupled to VDD.*

*43. The circuit of claim 35, wherein said MOS transistor is a multi-gate-finger MOS transistor.*

*44. The circuit of claim 35 further comprising an electrically conducting element coupled between said gate node and said base node.*

*45. The circuit of claim 44, wherein said electrically conducting element is a second resistor.*

*46. An ESD protection circuit, comprising:*

*a MOS transistor having a source node, a drain node, a gate node, and a base node, wherein said gate node is coupled to a first node through a first impedance and is coupled to a second node through a second impedance, wherein said base node is coupled to the first node through said first impedance and is coupled to the second node through said second impedance, and wherein said first node is subject to electrostatic-discharge stress during an ESD event.*

*47. The circuit of claim 46, wherein said first impedance comprises a capacitive element.*

*48. The circuit of claim 46, wherein said first node is coupled to said drain node.*

*49. The circuit of claim 46, wherein said first node is coupled to a single pad.*

*50. The circuit of claim 46, wherein said first node is coupled to a first power bus.*

*51. The circuit of claim 46, wherein said second node is coupled to said source node.*

*52. The circuit of claim 46, wherein said second node is coupled a second power bus.*

*53. The circuit of claim 46, wherein said MOS transistor is a NMOS transistor, said base region being a p-well, and said second node being coupled to ground.*

*54. The circuit of claim 46, wherein said MOS transistor is a PMOS transistor, said base node being an n-well, and said second node being coupled to VDD.*

*55. The circuit of claim 46, wherein said MOS transistor is a multi-gate-finger MOS transistor.*

*56. The circuit of claim 46, further comprising an electrically conducting element coupled between said gate node and said base node.*

*57. The circuit of claim 56, wherein said electrically conducting element is a resistor.*

* * * * *